United States Patent [19]
Konishi et al.

[11] Patent Number: 5,638,274
[45] Date of Patent: Jun. 10, 1997

[54] ELECTRONIC CONTROL APPARATUS FOR AN AIR-BAG SYSTEM

[75] Inventors: Hiroyuki Konishi, Himeji; Koichi Sugiyama, Nagoya, both of Japan

[73] Assignees: Fujitsu Ten Limited, Hyogo; Toyota Jidosha Kabushiki Kaisha, Aichi, both of Japan

[21] Appl. No.: 321,621

[22] Filed: Oct. 12, 1994

[30] Foreign Application Priority Data

Oct. 15, 1993 [JP] Japan .................. 5-258458

[51] Int. Cl.$^6$ .................. B60R 21/32
[52] U.S. Cl. .................. 364/424.055; 340/438; 307/10.1; 280/735
[58] Field of Search .................. 364/424.05; 340/436, 340/438; 307/10.1; 280/734, 735

[56] References Cited

U.S. PATENT DOCUMENTS

| | | | |
|---|---|---|---|
| 3,714,627 | 1/1973 | Dillman et al. | 340/436 |
| 3,745,523 | 7/1973 | Lewis et al. | 340/438 |
| 3,774,151 | 11/1973 | Lewis et al. | 280/735 |
| 3,863,208 | 1/1975 | Balban | 340/438 |
| 3,916,376 | 10/1975 | Tuttle | 340/438 |
| 3,920,937 | 11/1975 | Hollins | 307/10.1 |
| 4,366,465 | 12/1982 | Veneziano | 307/10.1 |
| 4,835,513 | 5/1989 | McCurdy et al. | 340/438 |
| 4,999,775 | 3/1991 | Muraoka | 364/424.03 |
| 5,045,835 | 9/1991 | Masegi et al. | 340/438 |
| 5,046,149 | 9/1991 | Nunan | 307/10.1 |
| 5,135,254 | 8/1992 | Masegi et al. | 280/735 |
| 5,164,901 | 11/1992 | Blackburn et al. | 364/424.05 |
| 5,170,066 | 12/1992 | Huber | 307/10.1 |
| 5,187,382 | 2/1993 | Kondo | 307/10.1 |
| 5,293,153 | 3/1994 | Rochette et al. | 340/438 |
| 5,331,211 | 7/1994 | Kondo et al. | 307/10.1 |
| 5,365,114 | 11/1994 | Tsurushima et al. | 307/10.1 |
| 5,365,438 | 11/1994 | Mitchell et al. | 364/424.03 |
| 5,493,270 | 2/1996 | Kondo | 340/438 |

FOREIGN PATENT DOCUMENTS

| | | |
|---|---|---|
| 39 13 628 | 11/1989 | Germany . |
| 43 21 589 | 1/1994 | Germany . |
| 54-40435 | 3/1979 | Japan . |
| 1-157053 | 10/1989 | Japan . |
| 1-274628 | 11/1989 | Japan . |
| 2-14946 | 1/1990 | Japan . |
| 4-127057 U | 11/1992 | Japan . |
| 5-58518 | 8/1993 | Japan . |
| 89 04779 | 6/1989 | WIPO . |
| 91 00637 | 1/1991 | WIPO . |

*Primary Examiner*—Kevin J. Teska
*Assistant Examiner*—Tyrone V. Walker
*Attorney, Agent, or Firm*—Oliff & Berridge

[57] ABSTRACT

An electrical control apparatus for the air bag system capable of inhibiting the diagnosis of back-up capacitors when a diagnosing routine is initiated by an extraneous noise. In a main routine executed by a microcomputer provided in an electrical control apparatus for an air-bag system, data stored in a specific address of a volatile memory is read out, and it is determined whether or not its value is the same as a fixed value. If the result is affirmative, it is determined that the main routine is started by an extraneous noise, an ignition flag IG is reset, and the diagnosis of the back-up capacitors is inhibited. On the other hand, if the data does not have the same value as the fixed value, it is determined that the ignition switch is turned on again after it has been turned off, the IG is set, and the diagnosis for back-up capacitors is carried out.

20 Claims, 5 Drawing Sheets

ELECTRONIC CONTROL APPARATUS FOR AN AIR-BAG SYSTEM

BACKGROUND OF THE INVENTION

1. Field of the Invention

The present invention relates to an electronic control apparatus for an air-bag system, especially to an electronic control apparatus for an air-bag system with a capability of diagnosing accurately whether or not a back-up power is normal.

2. Description of the Related Art

In recent years, air-bag systems have been widely used for protecting passengers in a crash. As it is necessary for an air-bag to definitely expand when a crash occurs, but never to expand under normal circumstances, an electronic control apparatus using a microcomputer system is generally used as a control apparatus for the air-bag system. In the system, a capacitor having a large capacitance is provided to function as a back-up power source in the event that a battery that normally provides power is failed. The back-up capacitor is normally charged by the battery, and the electronic control apparatus is powered by the back-up capacitor if the battery is failed.

FIG. 6 shows a functional diagram of a conventional electronic control apparatus for an air-bag system. In the figure, a controller 63 is connected to the plus terminal of a battery 61 through an ignition switch 62. A back-up capacitor 64 is connected in parallel to the controller 63 through a diode 65 and charging resistor 66 which are connected in parallel with each other. When the battery 61 is operating normally, it supplies electric power to the controller 63 through the ignition switch 62, and charges the back-up capacitor 64 through the charging resistor 66. The direction of current flow is indicated by a solid arrow (a). If the terminal voltage Vb of the battery 61 drops or the connection is somehow broken, the charge stored in the back-up capacitor 64 is used to supply power to the controller 63 through the diode 65 to ensure minimal functioning. The direction of this current flow is indicated by a dotted arrow (b).

The controller 63 incorporates a diagnosing routine which diagnoses whether or not the back-up capacitor 64 is normal. This routine is executed each time the ignition switch 62 is turned on.

The conventional diagnosing scheme is to monitor the charge time of the capacitor to reach a voltage Vc, and judge that the back-up capacitor 64 is normal if the time required from the beginning of the diagnosis when the capacitor voltage Vc is at minimum, to the end of the diagnosis when Vc reaches its maximum value, is within a predetermined time interval.

If the back-up capacitor 64 becomes open, for example, if the lead wire 67 becomes disconnected, the capacitor voltage Vc reaches the terminal voltage Vb of the battery 61 immediately after the ignition switch 62 is turned on. Therefore, this kind of failure is detectable. If the back-up capacitor 64 becomes shorted, the capacitor voltage Vc does not increase after the ignition switch 62 is turned on. Therefore, this kind of failure is also detectable.

The controller 63, however, may spontaneously begin its diagnosis if it is reset by an extraneous noise, since it cannot determine whether a reset signal comes from the ignition switch 62 or is merely an extraneous noise. However, since discharging of the back-up capacitor 64 is not caused by an extraneous noise, the capacitor voltage Vc remains at the battery voltage Vb, so the diagnosis erroneously detects an open failure.

SUMMARY OF THE INVENTION

Therefore, the object of the present invention is to provide an electrical control apparatus for an air bag system capable of inhibiting diagnosis of a back-up capacitor when a diagnosing routine is initiated by an extraneous noise.

The electrical control apparatus for an air bag system according to the present invention comprises a means for diagnosing the status of back-up capacitors each time a reset signal is input; a means for determining whether or not a reset signal was initiated by an ignition switch being operated, before allowing the diagnosing means to starts the diagnosis of the back-up capacitor; and a means for controlling the operation of the diagnosing means so that the diagnosis is carried out only when a reset signal is initiated by the ignition switch, and is otherwise inhibited.

According to the present invention, the diagnosis of a back-up capacitor is initiated when the controller is reset by the ignition switch, and the diagnosis is inhibited when the controller is reset in any other way.

BRIEF DESCRIPTION OF THE DRAWINGS

The present invention will be more clearly understood from the description set forth below with reference to the accompanying drawings.

DESCRIPTION OF THE PREFERRED EMBODIMENT

Figure 1:
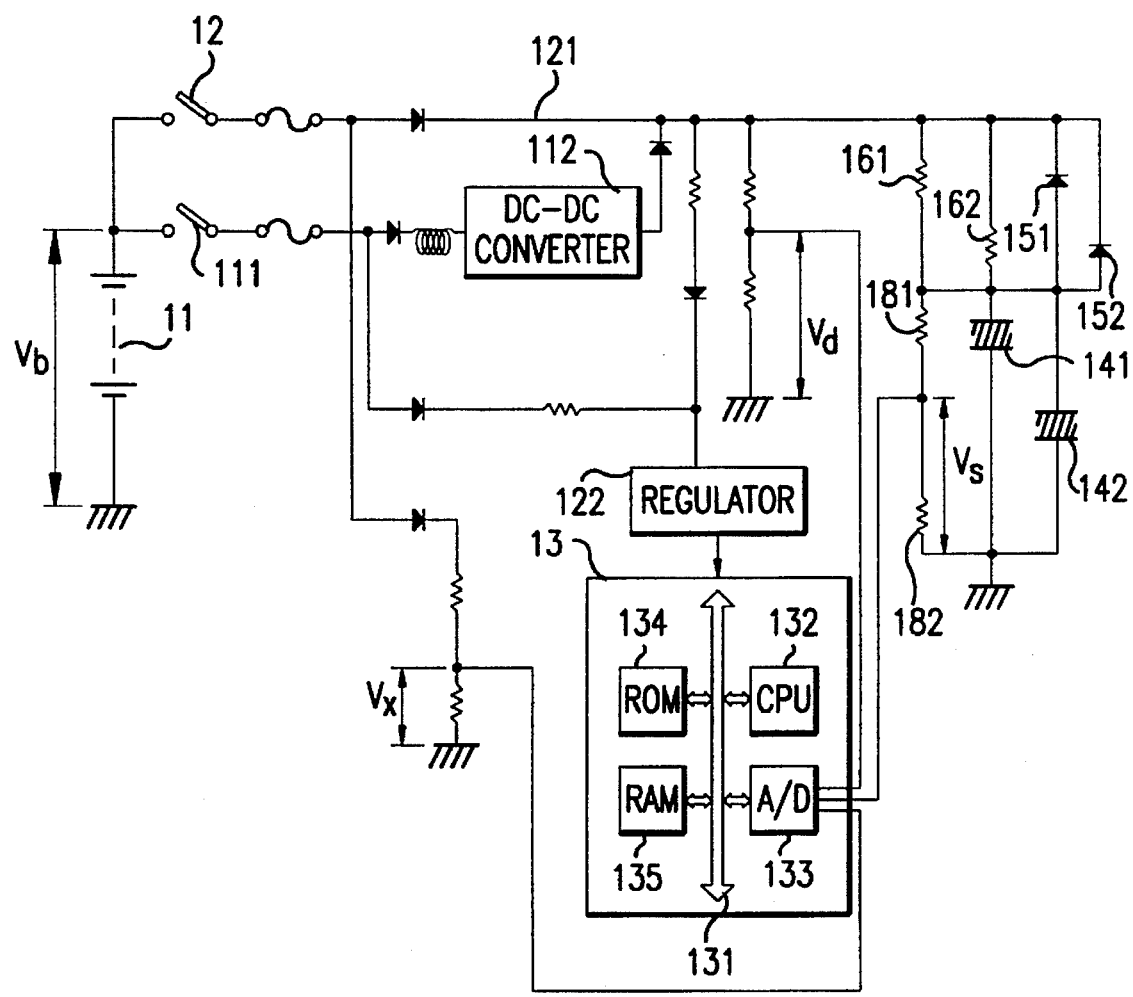
FIG. 1 is a circuit diagram of the embodiment of the present invention.

FIG. 1 is a circuit diagram of the embodiment of the electrical control apparatus for an air bag system according to the present invention. In the figure, a battery 11 supplies electric power to a microcomputer system 13 though an ignition switch 12, a bus 121 and a voltage regulator 122. Note, the voltage regulator 122 regulates the terminal voltage of the battery 11, which is about 12 Volts, to the voltage 10 supplied to the microcomputer system 13, which is 5 Volts.

Furthermore, in order to increase the reliability of the bus 121, the battery 11 is connected to the bus 121 through an accessory twitch 111 and a DC-DC converter 112. Note, the DC-DC converter 112 is provided to maintain the voltage on the bus 121 if the terminal voltage of the battery 11 drops. A connection between the accessory switch 111 and the regulator 122 is also provided.

Two (2) back-up capacitors 141, 142 are connected to the bus 121 through discharge diodes 151, 152 and discharge resistors 161, 162. Series connected voltage dividing resistors 181, 182 are connected in parallel with the two back-up capacitors 141, 142. The microcomputer system 13 is comprised of a CPU 132, an A/D converter 133, a non-volatile memory (ROM) 134 and a volatile memory (RAM) 135, which are connected to a data-bus 131.

Figure 2:
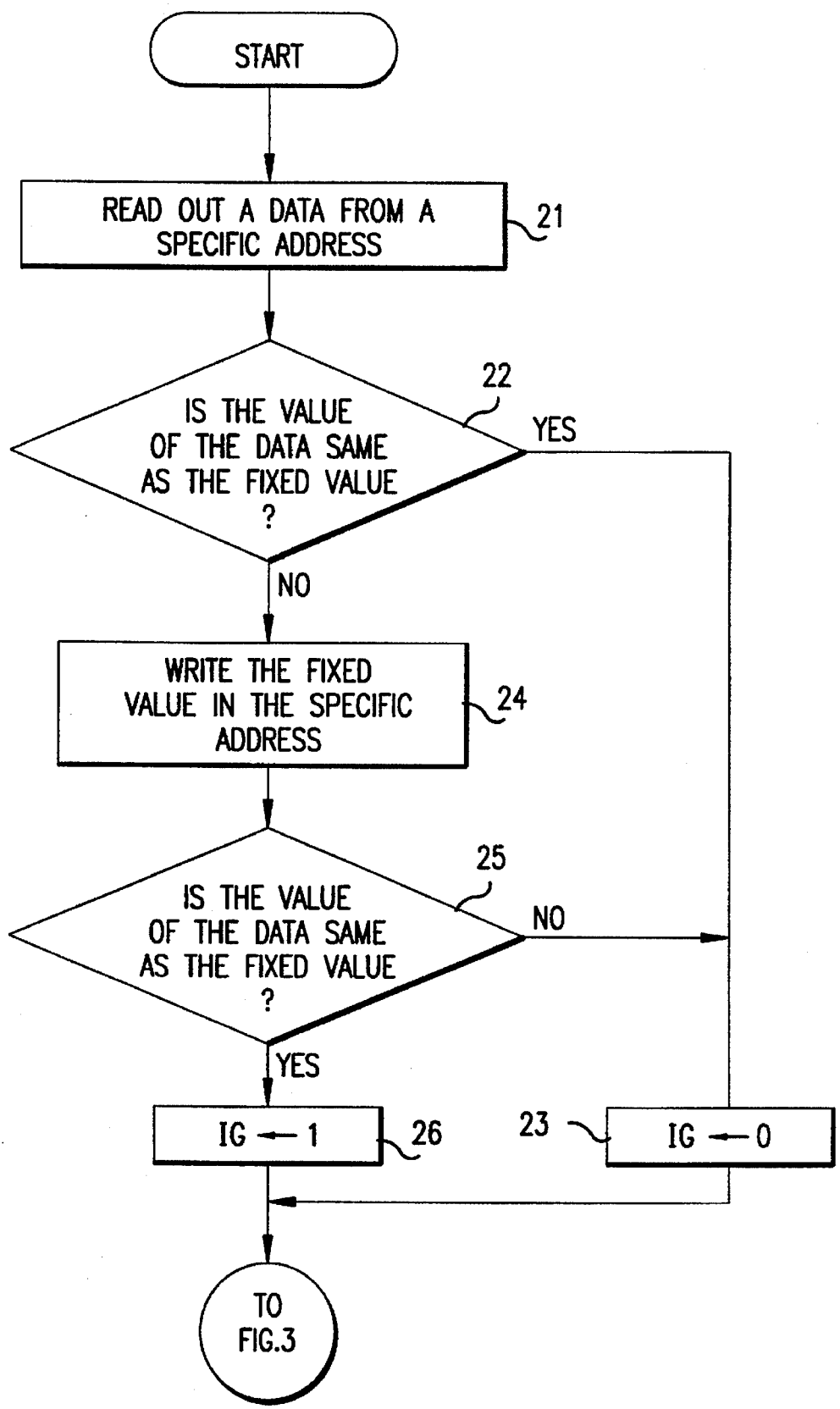
FIGS. 2 and 3 are a flowchart of the main routine of the control apparatus of the present invention.
Figure 3:
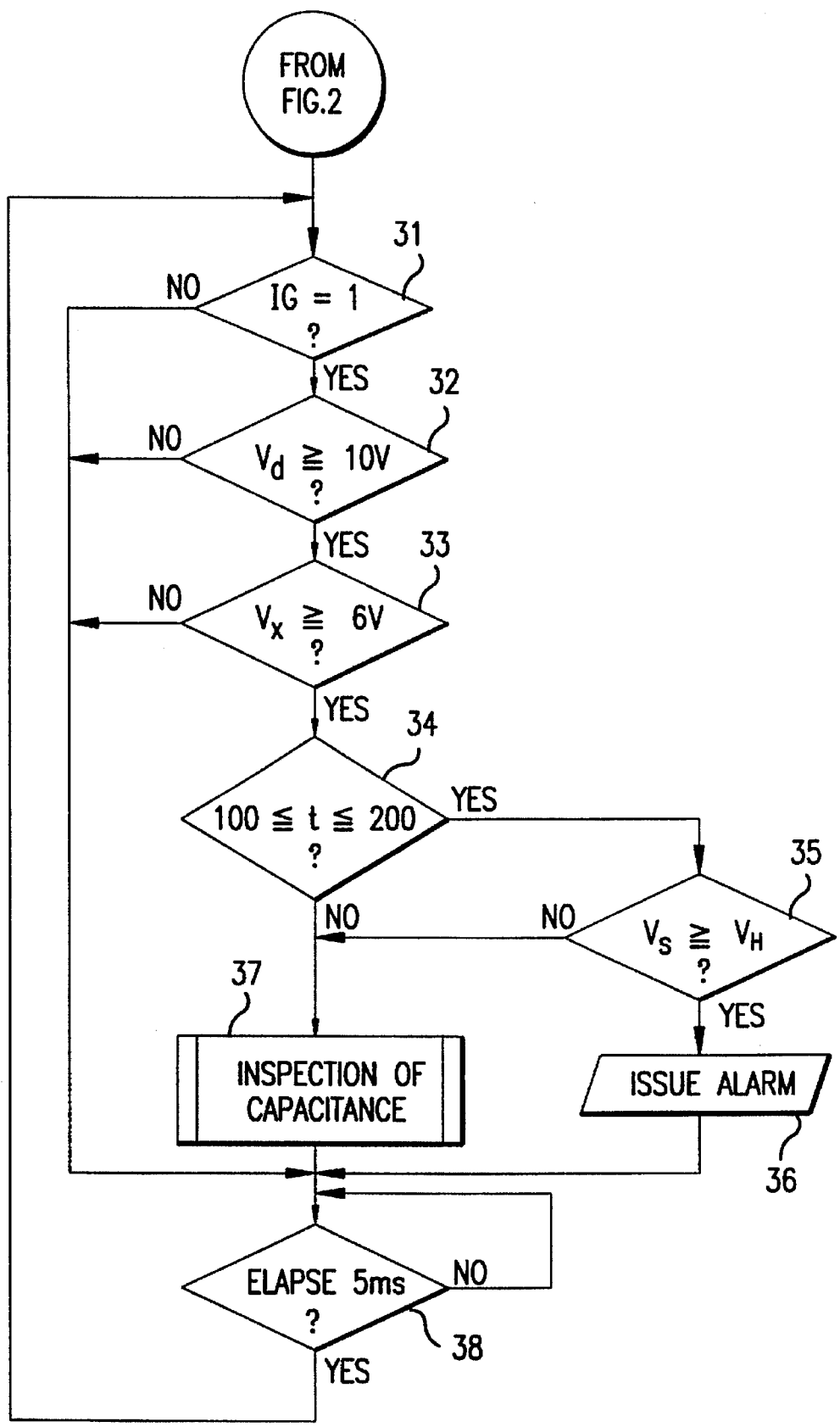

FIGS. 2 and 3 are a flowchart of the main routine stored in the non-volatile memory (ROM) 134. This main routine is executed every time the CPU 132 is reset. In the routine, data is read out from a specific address in the volatile memory (RAM) 135 at a step and it is determined at a step 22 whether or not this data has the same value as a predetermined fixed value. If the data has the same value as the fixed value, it is determined that the CPU 132 has been reset by an extraneous noise. That is because, when the CPU 132 is reset by an extraneous noise, electric power is continuously supplied to the microcomputer, so the data stored in the volatile memory 135 is not lost, and it is therefore determined that the data has the same value as the fixed value. If the result of the step 22 is affirmative, the control proceeds to a step 23, which resets an ignition flag IG.

On the other hand, if the result of the step 22 is negative, it is determined that the CPU 132 has been reset by the ignition switch 12 being turned on again after having been turned off. This is because, once the ignition switch 12 is turned off, the data stored in the volatile memory 135 is lost so its value is not the same as the value of the fixed value.

The control proceeds to a step 24 which stores the fixed value in the specific address of the volatile memory 135, and it is again determined at a step 25 whether or not the data read out from the specific address of the volatile memory 135 has the same value as the fixed value.

If the result of the step 25 is negative, it is determined that the volatile memory 135 has failed.

On the other hand, if the result of the step 25 is affirmative, it is determined that the volatile memory 135 is normal and the control proceeds to a step 26, which sets the ignition flag IG.

After the processes of the step 23 and the step 26 are finished, the control proceeds to FIG. 3.

At a step 31, it is determined whether or not the ignition flag IG is set, and if the ignition flag IG is not set, the control proceeds directly to a step 38 because the condition for diagnosing the back-up capacitors 141, 142 is not satisfied. If the result of the step 31 is affirmative, it is determined whether or not the DC-DC converter 112 is normal by determining whether or not a voltage Vd which is proportional to an output terminal voltage Of the DC-DC converter 112, is higher than a first predetermined voltage (for example, 10V) at a step 32. If the result of the step 32 is affirmative, the control proceeds directly to the step 38 without diagnosing the back-up capacitors 141, 142. If the result of the step 32 is negative, it is determined whether or not the battery 11 is normal by determining whether a voltage Vx which is proportional to a terminal voltage Vb of the battery 11 is higher than a second predetermined voltage (for example, 6 V) at a step 33. If it is determined that the battery 11 is not normal, the control proceeds directly to step 38 without diagnosing the back-up capacitors 141, 142.

Note, when it is determined that the DC-DC converter 112 or the battery 11 is abnormal, they are diagnosed by another diagnosing routine (not shown).

If the result of the step 33 is affirmative, the control proceeds to a step 34 which determines whether or not a time t elapsed after the start of the main routine is longer than 100 ms and shorter than 200 ms. If the result of the step 34 is affirmative, the control proceeds to a step 35 which determines whether or not a monitored voltage Vs which is proportional to a terminal voltage of the back-up capacitors 141, 142, is higher than a high threshold voltage $V_H$ (for example, 9V). If the result of the step 35 is affirmative, the control proceeds to a step 36 which issues an alarm indicating that the monitored voltage Vs rises quickly because the connection to the back-up capacitors is cut and the back-up capacitors cannot be charged. The control then proceeds to a step 38.

If the result of the step 34 or the step 35 is negative, the control proceeds to a step 37 at which the back-up capacitors 141, 142 are checked, and the control then proceeds to the step 38. At the step 38, it is determined whether or not a predetermined time interval, for example 5 ms, has elapsed, and the control returns to the step 31 after that time interval elapses.

Figure 4:
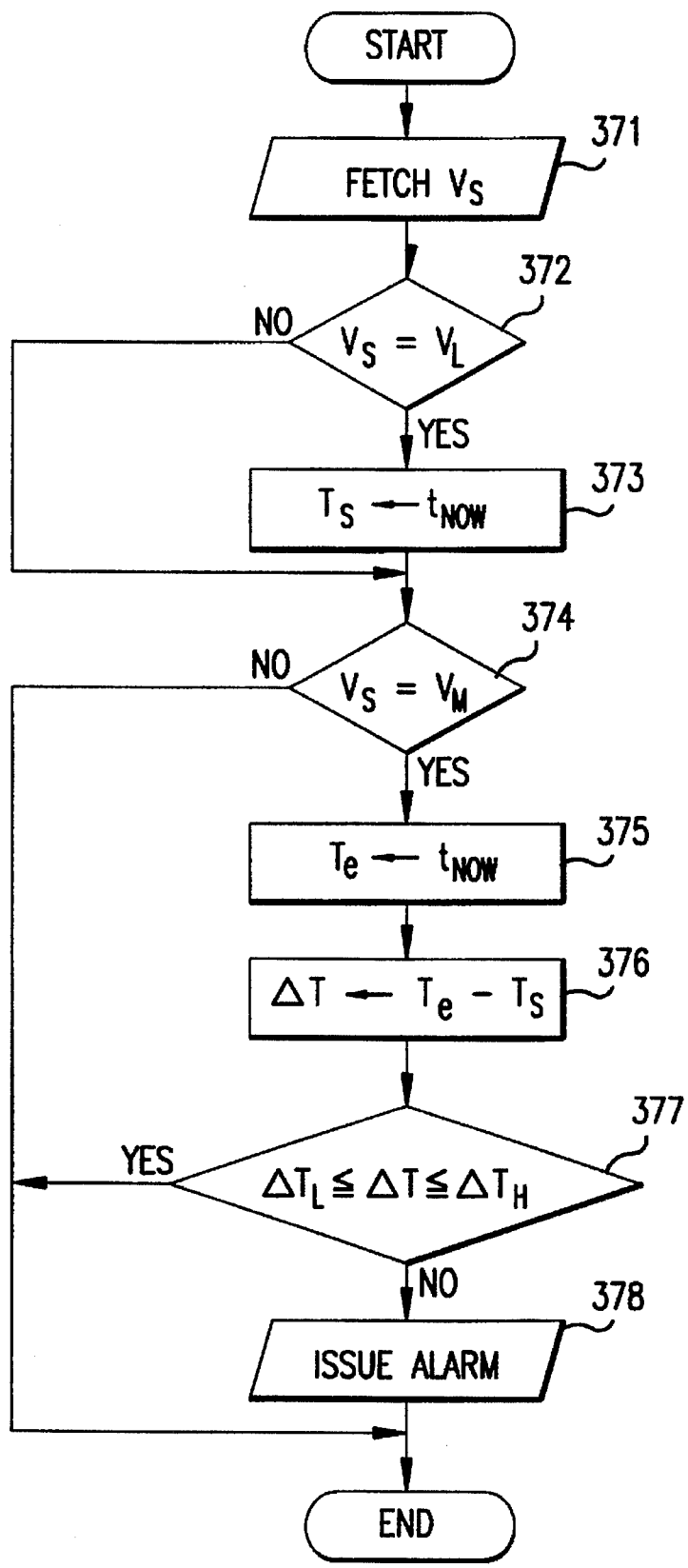
FIG. 4 is a flowchart of an inspection routine.

FIG. 4 is a flowchart of a routine executed in the step 37 of the main routine. First, the monitored voltage Vs is fetched at a step 371. At a step 372, it is determined whether or not the monitored voltage Vs rises to a low threshold voltage $V_L$ (for example 3 V). If the result of the step 372 is affirmative, the control proceeds to a step 373 which stores present time $t_{NOW}$ as an inspection starting time Ts. The control proceeds to a step 374. If the result of the step 372 is negative, the control proceeds directly to the step 374.

At the step 374, it is determined whether or not the monitored voltage Vs rises to the middle threshold voltage $v_M$ (for example 6V), and if affirmative, the control proceeds to a step 375 which stores present time $t_{NOW}$ as an inspection terminating time Te. The control then proceeds to a step 376.

A time interval ΔT from Ts to Te is calculated at the step 376, and it is determined whether or not the time interval ΔT is larger than a minimum time interval $\Delta T_L$ and shorter than a maximum time interval $\Delta T_K$ at a step 377. If the result of the step 377 is negative, the control proceeds to a step 378 which issues an alarm that the capacitance of the back-up capacitors has decreased excessively, and the control terminates.

If the result of the step 374 is negative, the control terminates directly because the back-up capacitors 141, 142 are already charged enough.

If the result of the step 377 is affirmative, the control terminates directly because the back-up capacitors 141, 142 are charged at a predetermined time constant.

Figure 5:
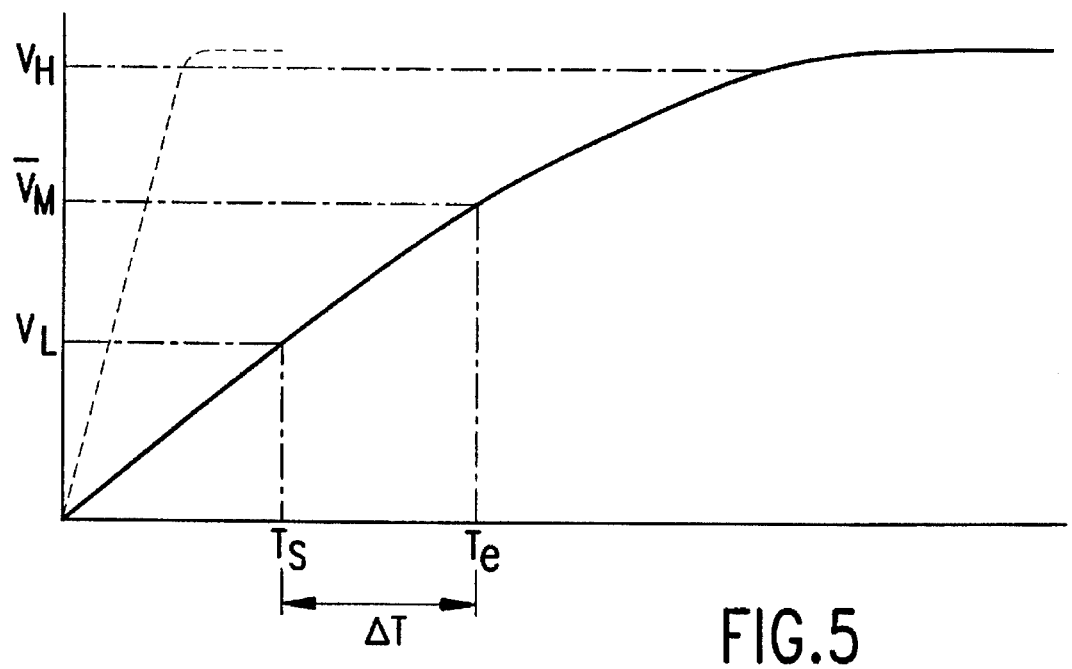
FIG. 5 is a graph showing a charging curve.
Figure 6:
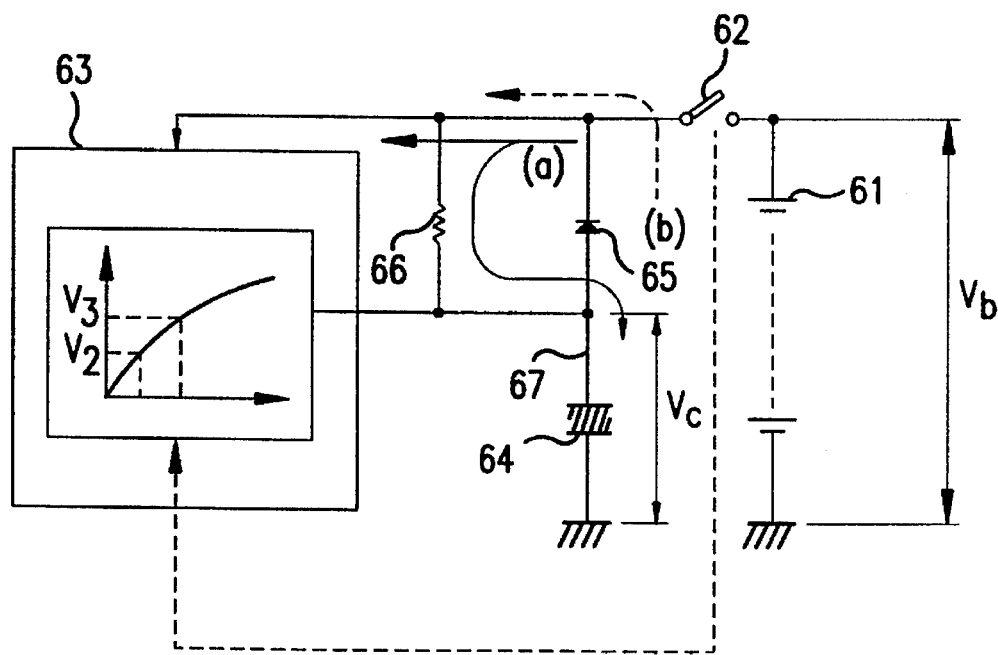
FIG. 6 is a functional circuit diagram of a prior art electronic control apparatus for an air bag system.

FIG. 5 is a graph showing the charging curve of the back-up capacitors 141, 142. The abscissa denotes time and the ordinate denotes voltage. The charging voltage rises with a time constant determined from the resistance of the charging resistors 161, 162 and the capacitance of the back-up capacitors 141, 142. Therefore, when the back-up capacitors 141, 142 are normal, the monitored voltage Vs rises as shown by a solid line, and the time difference from the time when the monitored voltage Vs reaches the low threshold voltage $V_L$ to the time when it reaches the middle threshold voltage $V_M$ within the predetermined time interval. On the other hand, if the connections to the back-up capacitors 141, 142 become open, the monitored voltage Vs rises quickly over the high threshold voltage $V_H$ as shown by the dashed line after the ignition switch 12 is closed.

If the CPU 132 is reset by an extraneous noise, the main routine is initiated, but the ignition flag IG remains reset. Therefore, the alarm, which denotes that the connections to the back-up capacitors are open and the monitored voltage Vs rises quickly as shown by the dashed line because the back-up capacitors are not discharged by the diagnosing signal, is not issued.

According to the electrical control apparatus for an air-bag system of this invention, when the CPU is reset by an extraneous noise and the diagnosis of the back-up capacitors is initiated, a mis-diagnosis due to the back-up capacitors not discharging, is securely prevented.

We claim:

1. An electronic control apparatus for diagnosing an operational status of a back-up capacitor of an air-bag system, the apparatus comprising:

means for diagnosing, each time a reset signal is input, whether the operational status of the back-up capacitor is normal;

means for determining whether the reset signal was initiated by operation of an ignition switch or whether the reset signal was initiated by a source other than the operation of the ignition switch; and means for controlling execution of said diagnosing means so that the diagnosis is carried out only when the determining means determines that the reset signal was initiated by the operation of the ignition switch, said controlling means inhibiting the diagnosis by said diagnosing means when said determining means determines said reset signal was initiated by the source other than the operation of the ignition switch, said controlling means improving a reliability of the diagnosis of the operational status of the back-up capacitor.

2. An electronic control apparatus for diagnosing the operational status of a back-up capacitor of an air-bag system of claim 1, wherein said diagnosing means comprises:

means for storing a present time as an inspection starting time when a terminal voltage of said back-up capacitor reaches a low threshold voltage;

means for storing a present time as an inspection terminating time when the terminal voltage of said back-up capacitor reaches a mid threshold voltage which is higher than said low threshold voltage;

means for determining a time interval from said inspection starting time to said inspection terminating time; and means for determining that the operational status of said back-up capacitor is normal only when said time interval is within a predetermined time interval.

3. An electronic control apparatus for diagnosing the operational status of a back-up capacitor of an air-bag system of claim 1, wherein said controlling means further comprises means for inhibiting the diagnosis when a voltage of an electric power bus provided in said electronic control apparatus for the air-bag system is lower than a first predetermined voltage.

4. An electronic control apparatus for diagnosing the operational status of a back-up capacitor of an air-bag system of claim 1, wherein said controlling means further comprises means for inhibiting the diagnosis when the voltage of a battery is lower than a second predetermined voltage.

5. An electronic control apparatus for diagnosing the operational status of a back-up capacitor of an air-bag system of claim 2, wherein said controlling means further comprises means for inhibiting the diagnosis when a terminal voltage of said back-up capacitor rises over a high threshold voltage, which is higher than said mid threshold voltage, within a predetermined time.

6. In an electronic control apparatus for an air-bag system, a method of diagnosing, each time a reset signal in input, an operational status of a back-up capacitor comprising:

determining whether the reset signal was initiated by operation of an ignition switch or whether the reset signal was initiated by a source other than the operation of the ignition switch before allowing a diagnosing means to start the diagnosis of the operational status of said back-up capacitor; and controlling the diagnosis so that it is carried out only when the reset signal was initiated by the operation of the ignition switch, and inhibiting the diagnosis when the reset signal was initiated by the source other than the operation of the ignition switch, said controlling means improving a reliability of the diagnosis of the operational status of the back-up capacitor.

7. A method of diagnosing the operational status of a back-up capacitor of claim 6, wherein said diagnosing step comprises:

storing a present time as an inspection starting time when a terminal voltage of said back-up capacitor reaches a low threshold voltage;

storing a present time as an inspection terminating time when the terminal voltage of said back-up capacitor reaches a mid threshold voltage which is higher than said low threshold voltage;

determining a time interval from said inspection starting time to said inspection terminating time; and judging that the operational status of said back-up capacitor is normal only when said time interval is within a predetermined time interval.

8. A method of diagnosing the operational status of a back-up capacitor of claim 6, wherein said controlling step further comprises inhibiting the diagnosis when a voltage of an electric power bus provided in said electronic control apparatus for an air-bag system is lower than a first predetermined voltage.

9. A method of diagnosing the operational status of a back-up capacitor of claim 6, wherein said controlling step further comprises inhibiting the diagnosis when the voltage of a battery is lower than a second predetermined voltage.

10. A method of diagnosing the operational status of a back-up capacitor of claim 7, wherein said controlling step further comprises inhibiting the diagnosis when the terminal voltage of said back-up capacitor rises, within a predetermined time, over a high threshold voltage which is higher than said mid threshold voltage.

11. An electronic control apparatus for diagnosing an operational status of a back-up capacitor of an air-bag system, the apparatus comprising:

means for diagnosing, each time a reset signal is input, whether the operational status of the back-up capacitor is normal or has failed;

means for determining whether the reset signal was initiated by operation of an ignition switch or whether a reset signal was initiated by a source other than the operation of the ignition switch before allowing said diagnosing means to start the diagnosis of the operational status of said back-up capacitor, said determining means comprising:

means for reading data from a specific address in a volatile memory, means for judging whether the data read out from the specific address in the volatile memory of said electronic control apparatus has a same value as a predetermined fixed value, and means for writing the fixed value in the specific address in the volatile memory when said judging means judges that the data is not the same value as the predetermined fixed value; and means for controlling execution of said diagnosing means so that the diagnosis is carried out only when the reset signal was initiated by the operation of the ignition switch, said controlling means inhibiting said reset signal being input to said diagnosing means when said determining means determines said reset signal was initiated by the source other than the operation of the ignition switch, said controlling means improving a reliability of the diagnosis of the operational status of the back-up capacitor.

12. An electronic control apparatus for diagnosing the operational status of a back-up capacitor of an air-bag system of claim 13, wherein said diagnosing means comprises:

means for storing a present time as an inspection starting time when a terminal voltage of said back-up capacitor reaches a low threshold voltage;

means for storing a present time as an inspection terminating time when the terminal voltage of said back-up capacitor reaches a mid threshold voltage which is higher than said low threshold voltage;

means for determining a time interval from said inspection starting time to said inspection terminating time; and means for determining that the operational status of said back-up capacitor is normal only when said time interval is within a predetermined time interval.

13. An electronic control apparatus for diagnosing the operational status of a back-up capacitor of an air-bag system of claim 11, wherein said controlling means further comprises means for inhibiting the diagnosis when a voltage of an electric power bus provided in said electronic control apparatus for an air-bag system is lower than a first predetermined voltage.

14. An electronic control apparatus for diagnosing the operational status of a back-up capacitor of an air-bag system of claim 11, wherein said controlling means further comprises means for inhibiting the diagnosis when the voltage of a battery is lower than a second predetermined voltage.

15. An electronic control apparatus for diagnosing the operational status of a back-up capacitor of an air-bag system of claim 12, wherein said controlling means further comprises means for inhibiting the diagnosis when the terminal voltage of said back-up capacitor rises, within a predetermined time, over a high threshold voltage which is higher than said mid threshold voltage.

16. In an electronic control apparatus for an air-bag system, a method of diagnosing an operational status of a back-up capacitor, each time a reset signal is input, comprising:

determining whether the reset signal was initiated by operation of an ignition switch or whether the reset signal was initiated by a source other than the operation of the ignition switch before allowing a diagnosing means to start the diagnosis of the operational status of said back-up capacitor, said determining further comprising:

reading data from a specific address in a volatile memory of said electronic control apparatus, judging whether the data read out from the specific address has a same value as a predetermined fixed value, and writing the fixed value in the specific address in the volatile memory when said judging step judges that the data is not the same value as the predetermined fixed value; and controlling the diagnosis so that it is carried out only when the reset signal was initiated by the operation of the ignition switch, and inhibiting the diagnosis when the reset signal was initiated by the source other than the operation of the ignition switch.

17. A method of diagnosing the operational status of a back-up capacitor of claim 16, wherein said diagnosing step comprises:

storing a present time as an inspection starting time when a terminal voltage of said back-up capacitor reaches a lower threshold voltage;

storing a present time as an inspection terminating time when the terminal voltage of said back-up capacitor reaches a mid threshold voltage which is higher than said low threshold voltage;

determining a time interval from said inspection starting time to said inspection terminating time; and judging that said back-up capacitor is normal only when said time interval is within a predetermined time interval.

18. A method of diagnosing the operational status of a back-up capacitor of claim 16, wherein said controlling step further comprises inhibiting the diagnosis when a voltage of an electric power bus provided in said electronic control apparatus for an air-bag system is lower than a first predetermined voltage.

19. A method of diagnosing the operational status of a back-up capacitor of claim 16, wherein said controlling step further comprises inhibiting the diagnosis when the voltage of a battery is lower than a second predetermined voltage.

20. A method of diagnosing the operational status of a back-up capacitor of claim 17, wherein said controlling step further comprises inhibiting the diagnosis when the terminal voltage of said back-up capacitor rises, within a predetermined time, over a high threshold voltage which is higher than said mid threshold voltage.

* * * * *